United States Patent [19]

Matsumoto

[11] Patent Number: 5,023,570
[45] Date of Patent: Jun. 11, 1991

[54] EMITTER-FOLLOWER CIRCUIT

[75] Inventor: Kouichi Matsumoto, Tokyo, Japan

[73] Assignee: NEC Corporation, Japan

[21] Appl. No.: 478,843

[22] Filed: Feb. 12, 1990

[30] Foreign Application Priority Data

Feb. 21, 1989 [JP] Japan .................................. 1-41109

[51] Int. Cl.⁵ ........................ H01H 7/20; H03K 5/08
[52] U.S. Cl. .................................. 330/299; 330/298; 307/544
[58] Field of Search ............... 307/300, 540, 544, 555; 330/207 P, 296, 297, 298, 299

[56] References Cited

U.S. PATENT DOCUMENTS

| | | | |
|---|---|---|---|
| 3,668,545 | 6/1972 | Von Recklinghausen | 330/299 X |
| 3,678,408 | 7/1972 | Suzuki | 330/229 X |
| 4,451,747 | 5/1984 | Rucker, III | 307/555 X |

Primary Examiner—Steven Mottola
Attorney, Agent, or Firm—Laff, Whitesel, Conte & Saret

[57] ABSTRACT

An emitter-follower circuit includes a bipolar transistor of a first conductivity type operating as an emitter-follower transistor and a bipolar transistor of a second conductivity type operable as a clamping transistor. The voltage developed between the base and the emitter of the second conductivity type clamping transistor is adapted to clamp the voltage developed between the base and the collector of the first conductivity type transistor, so that such a high voltage as exceeding the breakdown voltage is not developed between the collector and the emitter of the first conductivity type transistor. The emitter-follower circuit is capable of operating with safety even when an input signal applied thereto has a wide range of direct current components.

7 Claims, 2 Drawing Sheets

F I G. 3
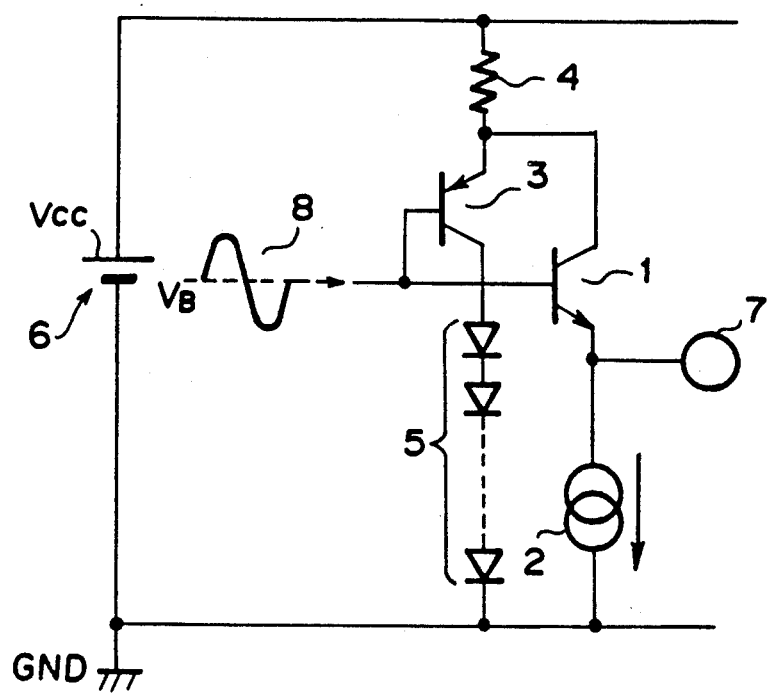
F I G. 4
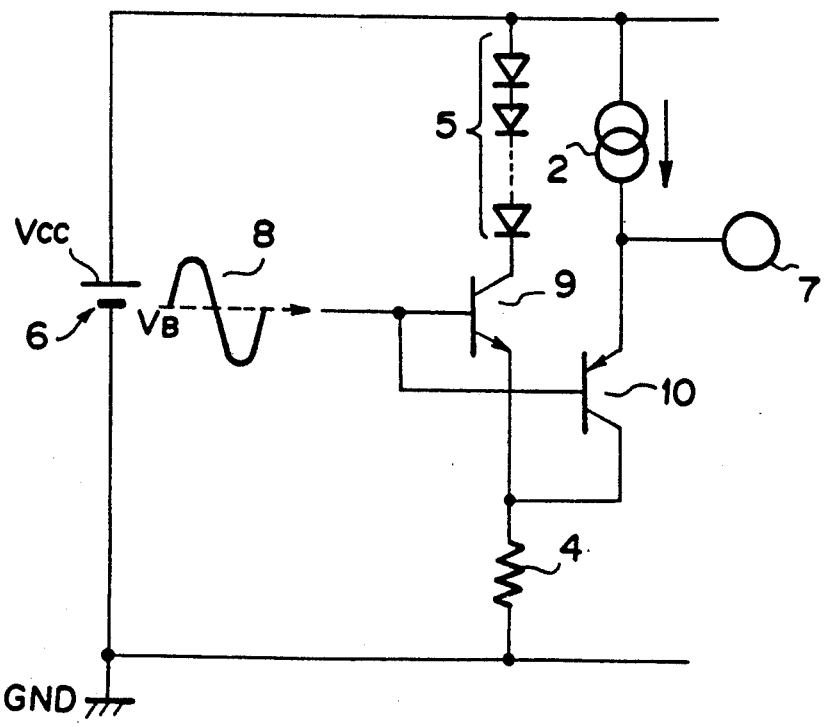

EMITTER-FOLLOWER CIRCUIT

BACKGROUND OF THE INVENTION

The present invention relates to an emitter-follower circuit and, more particularly, to an emitter-follower circuit which is capable of operating with safety even when an input signal applied thereto has a wide range of direct current components.

An emitter-follower circuit is one type of transistor amplifier circuit and has a configuration of a common-collector connection in which an input signal is applied to the base and an output is taken from the emitter of the transistor. The characterizing feature of the emitter-follower circuit is that it has a high input impedance, low output impedance, and near-unity voltage gain. Because of the above feature, such emitter-follower circuit is most widely used as an impedance transformer or a buffer amplifier, to prevent loading of a preceding signal source by the low input impedance of a following stage.

In the conventional emitter-follower circuits, a selection of a proper bipolar transistor to be used therein and further a determination of the circuit constants therefor are not difficult if a direct current component included in the input signal to be inputted to the circuit is known beforehand and the value thereof does not exceed the inherent breakdown voltage of the bipolar transistor and does not vary during its operating state.

However, as is the case with an output signal from a CCD (Charge Coupled Device) image sensor, when a signal in which a direct current component included in the output signal varies considerably, e.g., from 6 (V) to 13 (V) is inputted as in input signal without having a coupling capacitor intervened, a high voltage which exceeds the breakdown voltage of the bipolar transistor is developed between the collector and the emitter thereof in response to a decrease in the base voltage. Thus, for using the circuit in such applications, the most unfavorable conditions must be taken itno account and it is necessary to select a transistor which has a high breakdown voltage property between the collector and the emitter. For increasing the breakdown voltage property between the collector and the emitter of the bipolar transistor, one method now available is to adopt a high breakdown voltage process as a transistor manufacturing process. However, generally, the operating speed of such transistors as having been manufactured by the high breakdown voltage process is low and the chip area of such transistor becomes unavoidably large. All the transistors of the same kind on the single substrate are formed similarly by the same manufacturing process. If the high breakdown voltage process is adapted, the breakdown voltages of all the bipolar transistors are increased, while the overall operating speed of the circuits composed of such transistors becomes lower and this imposes limitations to the fields in which the circits may be used and also causes a large added cost due to an increase in the chip size involved.

SUMMARY OF THE INVENTION

It is an object of the present invention to provide an improved emitter-follower circuit which overcomes the problems explained above.

It is another object of the present invention to provide an emitter-follower circuit which is capable of operating with safety even when an input signal applied thereto has a wide range of direct current components.

It is a further object of the present invention to provide an emitter-follower circuit whose operating speed is high and chip size is small.

It is still further object of the present invention to provide an emitter-follower circuit in which a transistor having a low breakdown voltage property between its collector and emitter can be used even when a direct current component included in the input signal varies considerably.

According to the present invention, there is provided an emitter-follower circuit, comprising:
- a first and a second power supply source and an input and an output terminal;
- a resistor connected at its one end to said first power supply source;
- a first conductivity type transistor connected between the other end of said resistor and said output terminal, the base of said transistor being connected to said input terminal;
- a constant current means connected between said output terminal and said second power supply source;
- a second conductivity type transistor having its emitter connected to the other end of said resistor and its base being conected to said input terminal; and
- at least one diode connected in a forward direction with respect to the collector current of said second transistor between the collector of said second transistor and said second power supply source.

BRIEF DESCRIPTION OF THE DRAWINGS

The above and other objects, features and advantages of the present invention will be apparent from the following description of preferred embodiments of the invention with reference to the accompanying drawings, in which:

FIG. 3 shows a circuit diagram of an emitter-follower circuit of a first embodiment according to the present invention; and FIG. 4 shows a circuit diagram of an emitter-follower circit of a second embodiment according to the present invention.

PREFERRED EMBODIMENTS OF THE INVENTION

Throughout the following description, similar reference symbols or numerals refer to similar elements in all Figures of the drawings.

For the purpose of assisting in understanding of the present invention, one prior art arrangement will first be described briefly before the explanation of the present invention.

Figure 1:
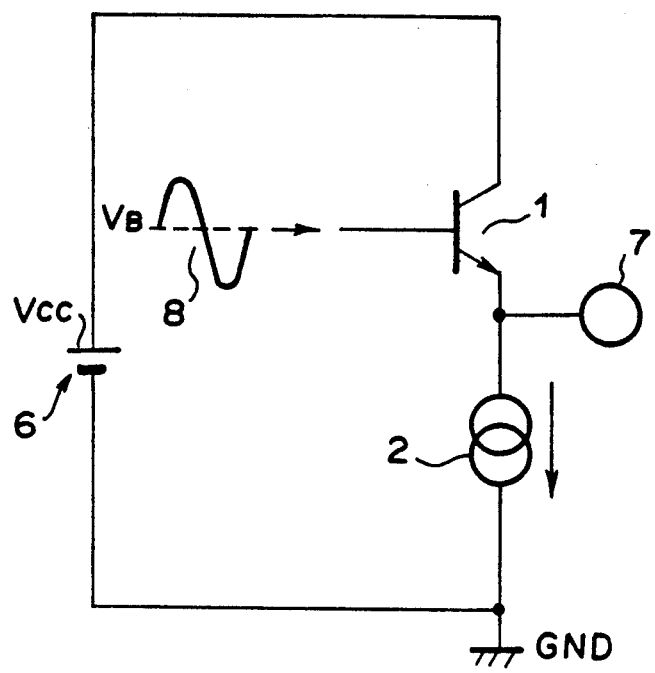
FIG. 1 shows a circuit diagram of a conventional emitter-follower circuit.
Figure 2:
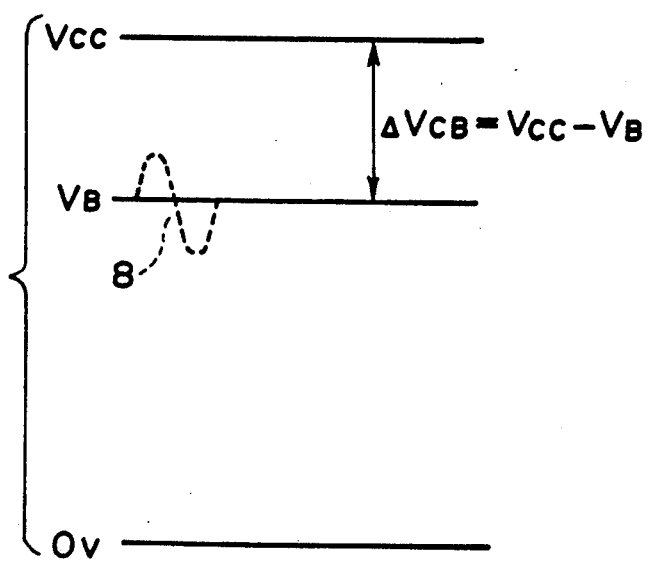
FIG. 2 shows the potential level of a direct current component in the input siganl with respect to the positive and negative potentials of the power supply source.

FIG. 1 shows a circuit diagram of a conventional emitter-follower circuit composed of an NPN bipolar transistor 1. The collector of the NPN transistor 1 is connected to a positive terminal (Vcc) of a power supply source 6 and the emitter thereof is connected to an output terminal 7 and also connected through a constant current souce 2 to a negative terminal (0 V) of the power supply source 6, which terminal is grounded. The signal having a direct current component $V_B$ as shown in FIG. 2 is applied as an input signal 8 to the base of the NPN bipolar transistor 1. FIG. 2 shows the respective direct current levels Vcc and $V_B$ of the power supply voltage and the input signal with the ground level taken as a reference.

In the conventional emitter-follower circuit as described above, a level change in the input signal 8 is followed by a change in the emitter voltage of the transistor 1, which is taken as an output signal to the output terminal 7.

The defect in the conventional circuit is that, if the direct current component in an input signal inputted to the circuit varies considerably and exceeds the inherent collector-emitter breakdown voltage of the transistor used, the transistor will be caused to be disrupted immediately. Such an unfavorable occurrence takes place, for example, when an output signal from a CCD image sensor, which signal has a direct current component varying between 6 (V) and 13 (V), is directly, that is, not via a coupling capacitor, forwarded to the circuit as an input signal. Thus, the present invention aims at providing an improved emitter-follower circuit which is capable of receiving directly such an output signal as outputted from a CCD image sensor.

Next, some preferred embodiments of the present invention are explained with reference to FIG. 3 and FIG. 4.

FIG. 3 shows a circuit diagram of a first embodiment of the present invention. The same reference numerals and symbols as used in FIG. 1 are used for the same or similar elements in FIG. 3 so as to avoid the repetition of the same explanation.

In this circuit, a resistor 4 is connected between the positive terminal (Vcc) of the power supply source 6 and the collector of the NPN bipolar transistor 1. To the collector of the NPN bipolar transistor 1 is also connected the emitter of PNP bipolar transistor 3, to the base of which is applied the input signal 8. Between the collector of the PNP transistor 3 and the ground, there are provided a plurality of serially connected diodes 5 with their respective cathodes being positioned toward the ground side.

In the emitter-follower circuit of this first embodiment having the above described configuration, the voltage ($V_{BC}$) developed between the base and the collector of the NPN bipolar transistor 1 is clamped by the voltage ($V_{BE}$) developed between the base and the emitter of the PNP bipolar transistor 3. As a result, even when the voltage of the input signal 8 drops followed by a drop of the emitter voltage of the transistor 1, there is no possibility that, since the collector voltage of the transistor 1 also drops following the voltage drop of the input signal 8, such a high voltage as exceeding the breakdown voltage of the transistor 1 will be developed between the collector and the emitter of the NPN bipolar transistor 1. The collector voltage of the NPN bipolar transistor 1 also varies in response to the changes in the input sisnal 8 but, since this transistor is functioning as an emitter-follower, there is no influence to the output thereof.

The serially connected diodes 5 function to maintain the collector voltage of the PNP bipolar transistor 3 higher than the ground level, so that the voltage developed between the collector and the emitter of the transistor 3 is moderated so as not to exceed the breakdown voltage thereof whereby the transistor 3 is protected from being disrupted. For example, assuming that four diodes 5 are connected in series, the voltage of the collector of the PNP bipolar transistor 3 increases by a voltage four times the potential barrier $V_F$ (approximately 0.6 V in the case of a Silicon diode) of one diode, and this means that the voltage between the collector and the emitter of the transistor 3 is moderated to the same extent as the rise in the collector voltage of the transistor 3.

Next, FIG. 4 shows a circuit diagram of an emitter-follower circuit of the second embodiment according to the invention. Here again the same or similar elements as in FIG. 3 are assigned to the same numerals or symbols and the repetition of the same description is exempted with in this FIG. 4.

In this second embodiment, a PNP bipolar transistor 10 is used as an emitter-follower transistor from which an output is taken and an NPN bipolar transistor 9 is used as a transistor for clamping the base-collector voltage ($V_{BC}$) of the above PNP transistor 10. One end of the resistor 4 is grounded and the other end is connected to the emitter of the NPN bipolar transistor 9. The input signal 8 is applied to the base of the NPN bipolar transistor 9. Between the positive terminal Vcc of the power supply source 6 and the collector of the NPN bipolar transistor 9, there are connected in series a plurality of diodes 5 with their respective anode sides being positioned toward the positive terminal Vcc of the power supply source 6.

In the emitter-follower circuit having the above configuration according to the second embodiment, the base-collector voltage ($V_{BC}$) developed in the PNP bipolar transistor 10 is clamped by the base-emitter voltage ($V_{BE}$) developed in the NPN bipolar transistor 9. Thus, when the voltage of the input signal 8 increases, this increase is followed by an increase in the emitter voltage of the PNP bipolar transistor 10. The collector voltage of this PNP transistor 10 also increases by being clamped by the base-emitter voltage ($V_{BE}$) of the NPN bipolar transistor 9. As a consequence, there is no possibility for such a high voltage as exceeding the breakdown voltage to be developed between the collector and the emitter of the PNP bipolar transistor 10.

Though, in the drawings of FIGS. 3 and 4, there are connected a plurality of serially connected diodes 5 to the collector of the clamping transistor 3 or 9, the number of diodes is not limited to a plurality thereof and it should be noted that there can be an instance where only one diode is sufficient for the purpose. The number of diodes 5 should be determined by having taken into consideration the level of the direct current component in the input signal and the inherent breakdown voltage of the transistor used.

As explained above, according to the present invention, since the base-collector voltage ($V_{BC}$) of the emitter-follower transistor of a first conductivity type is clamped by the base-emitter voltage ($V_{BE}$) of the clamping transistor of a second conductivity type, the voltage developed between the collector and the emitter of the emitter-follower transistor can be suppressed to a value sufficiently lower than the breakdown voltage thereof. Thus, the emitter-follower circuit of this invention can employ a transistor whose breakdown voltage between the collector and the emitter is low, whose operating speed is high and whose chip area is small, so that the circuit is free from restrictions related to a power supply voltage, a level of the direct current component in the input signal and the like.

While the invention has been described in its preferred embodiments, it is to be understood that the words which have been used are words of description rather than limitation and that changes within the purview of the appended claims may be made without departing from the true scope and spirit of the invention its broader aspects.

What is claimed is:

1. An emitter-follower circuit comprising:
    a first and a second power supply source and an input and an output terminal;
    a resistor connected at its one end to said first power supply source;
    a first conductivity type transistor connected between the other end of said resistor and said output terminal, the base of said transistor being connnected to said input terminal;
    a constant current means connected between said output terminal and said second power supply source;
    a second conductivity type transistor having its emitter connected to the other end of said resistor and its base being connected to said input terminal; and
    at least one diode connected in a forward direction with respect to the collector current of said second transistor between the collector of said second transistor and said second power supply source.

2. An emitter-follower circuit according to claim 1, in which said second conductivity type transistor is adapted to clamp the voltage developed between the base and the collector of said first conductivity type transistor by the voltage developed between the base and the emitter of said second transistor.

3. An emitter-follower circuit according to claim 1, in which a plurality of said diodes are connected in series between the collector of said second transistor and said second power supply source.

4. An emitter-follower circuit according to claim 1, in which said first conductivity type transistor is of an NPN type bipolar transistor and said second conductivity type transistor is of a PNP type bipolar transistor.

5. An emitter-follower circuit according to claim 4, in which said at least one diode is adapted to maintain the potential of the collector of said second conductivity type transistor higher than the potential of said second power supply source.

6. An emitter-follower circuit according to claim 1, in which said first conductivity type transistor is of a PNP type bipolar transistor and said second conductivity type transistor is of an NPN type bipolar transistor.

7. An emitter-follower circuit according to claim 6, in which said at least one diode is adapted to maintain the potential of the collector of said second conductivity type transistor lower than the potential of said second power supply source.

* * * * *